United States Patent [19]

Shiba et al.

[11] Patent Number: 4,458,302

[45] Date of Patent: Jul. 3, 1984

[54] REFLECTION TYPE OPTICAL FOCUSING APPARATUS

[75] Inventors: Masataka Shiba, Yokohama; Yoshitada Oshida, Fujsawa, both of Japan

[73] Assignee: Hitachi, Ltd., Tokyo, Japan

[21] Appl. No.: 384,679

[22] Filed: Jun. 2, 1982

[30] Foreign Application Priority Data

Jun. 3, 1981 [JP] Japan .................................. 56-84342
Jun. 3, 1981 [JP] Japan .................................. 56-84349

[51] Int. Cl.³ ............................................. F21V 7/00
[52] U.S. Cl. .................................... 362/303; 362/298; 362/302; 362/346; 362/347; 350/505
[58] Field of Search ............... 362/298, 302, 303, 346, 362/347; 355/27, 51, 60, 63; 350/505

[56] References Cited

U.S. PATENT DOCUMENTS 4,294,538 10/1981 Ban ......................................... 355/51

Primary Examiner—Stephen J. Lechert, Jr.
Attorney, Agent, or Firm—Antonelli, Terry & Wands

[57] ABSTRACT

A reflection-type optical focusing apparatus comprising an optical focusing system including at least two 4th-degree surface reflectors with their revolving symmetric axis formed by a line connecting the position of a point source and the point source focusing position, said reflectors being used in combination so that the light emitted from a point source placed at the point source position is focused to form a virtual point source at the point source focusing position, and a 4th-degree surface reflector with its cross-section, on a plane including the revolving symmetric axis, forming a part of an ellipse with its major axis having a certain inclination with respect to the revolving symmetric axis, said virtual point source being located at one focal point of the ellipse so that a light image in the shape of an arc band is obtained.

14 Claims, 17 Drawing Figures

FIG. 4A
FIG. 4B
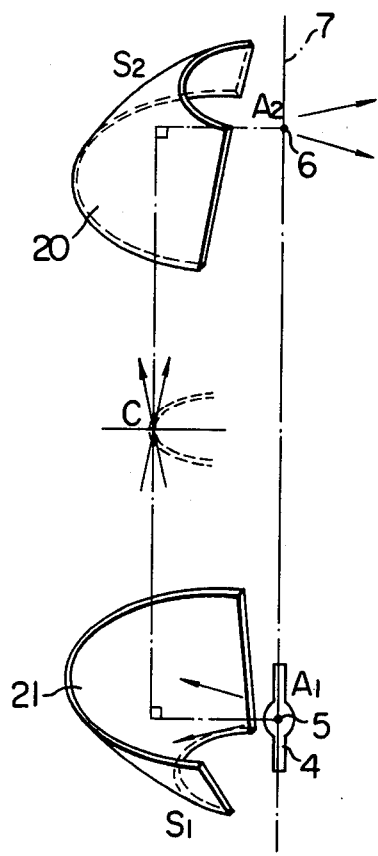
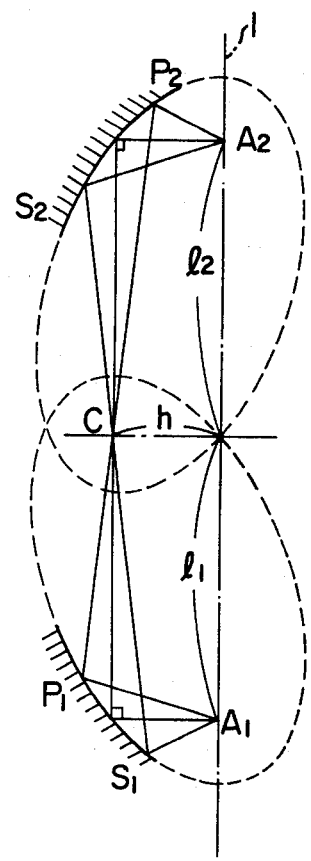

0  1  2mm

RADIAL DIRECTION OF ARC

4'

0 1 2mm

SPHERE/SPHERE /ELLIPSE (MODIFICATION SYSTEM)　THE 3RD REFLECTION 0 1 2mm

REFLECTION TYPE OPTICAL FOCUSING APPARATUS

The present invention relates to a reflection-type optical focusing apparatus which provides a light source in the shape of an arc band used in a full-size reflection-type exposing apparatus and the like.

The extra pressure mercury lamp and xenonmercury lamp used as a point source for exposing apparatus in semiconductor fabrication are shaped as shown in FIG. 1, where reference number 1 denotes a cathode electrode and denotes an anode electrode. Lamps of this type emit light by discharging, resulting in a somewhat planar light source rather than an ideal point source. Therefore, this light source is once focused at some position, then reduced to an ideal point source using a pinhole filter and the like.

Use of transmitting components such as lens for focusing a point source is undesirable for some wavelength, since it causes absorption and aberration. On the other hand, use of reflectors for focusing a light beam is free from these problems.

One of focusing methods using reflectors is the use of an ellipsoidal reflector. In this case, the highest light distribution intensity of the lamp appears in the perpendicular direction with respect to the main axis of the lamp, and in order to obtain the largest effective energy at the focal point, the reflector has to be shaped as shown in FIG. 2. In FIG. 2, reference number 3 shows the conventional ellipsoidal reflector, 4 is a lamp, 5 is the position of the point source, and 6 is the point source focusing position. However, the conventional ellipsoidal reflector 3, when provided with a larger radiation angle around the main axis, does not present a uniform light distribution around the focal point.

There is known an apparatus similar to the present invention, as disclosed in Japanese Patent Laid-open No. 54-123876 (corresponding to U.S. Pat. No. 4,294,538) However, this apparatus causes the failure of focusing in the meridian direction on the focal point due to coma aberration, resulting in a large energy loss when a pinhole filter is used.

It is therefore an object of the present invention to solve the foregoing prior art deficiencies and provde an optical focusing apparatus for obtaining a light source in the shape of an arc band having a uniform light distribution characteristic.

The present invention is also characterized in that there are provided reflectors each shaped in a fourth-degree surface whose cross-section forms a part of an ellipse with its major axis having a certain inclination with respect to the revolving symmetric axis, on one focal point of the ellipse is located the effective point light source, thereby obtaining an arc band light source to be used in an illuminating apparatus for a full-size reflection-type exposing apparatus having a high resolution and short exposing time.

The present invention is characterized in that there is provided the combination of at least two reflectors each shaped in a fourth-degree surface having a revolving symmetric axis formed by a line connecting the position of the point source and the position of the point source focal point, so that the effective point light source as described in the above paragraph, is obtained.

According to the present invention, a light source of a short wave length (deep UV) ranging 200–300 nm can be obtained by use of an Xe-Hg lamp which provides a point source, and a high resolution is achieved. Moreover, since optical transmitting components are not used, no optical loss occurs, and a light beam can be projected within a narrow band effectively.

The present invention will be apparent from the following detailed description taken in conjunction with the accompanying drawings, in which:

FIG. 4A is an illustation showing an embodiment of the present invention;

FIG. 4B is a cross-sectional view of the arrangement shown in FIG. 4A;

Figure 13:
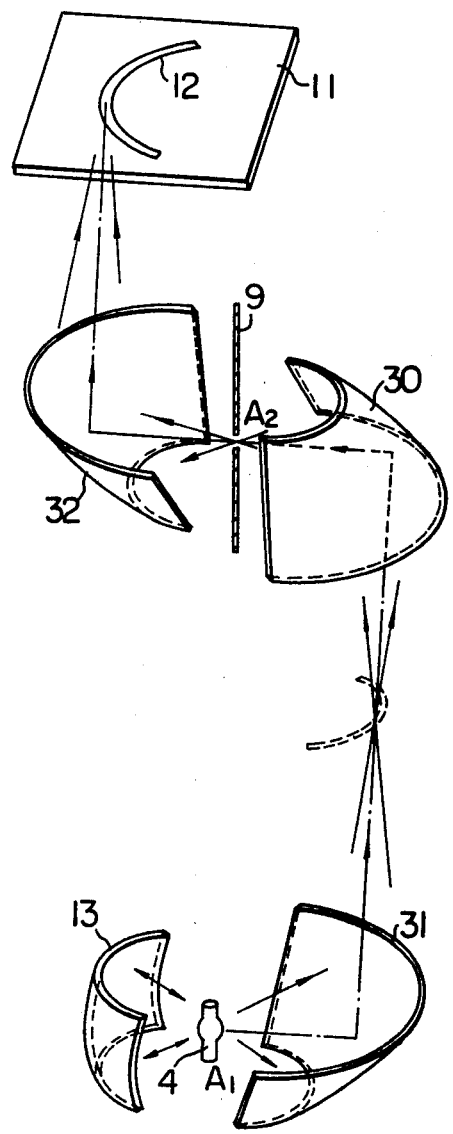
FIG. 13 is an illustration exemplifying a means for obtaining an effective point source according to the present invention.
Figure 16:
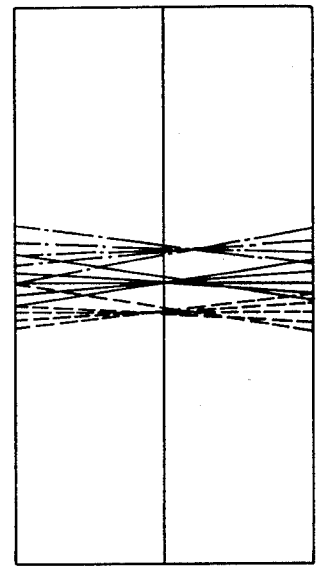
Figure 15:
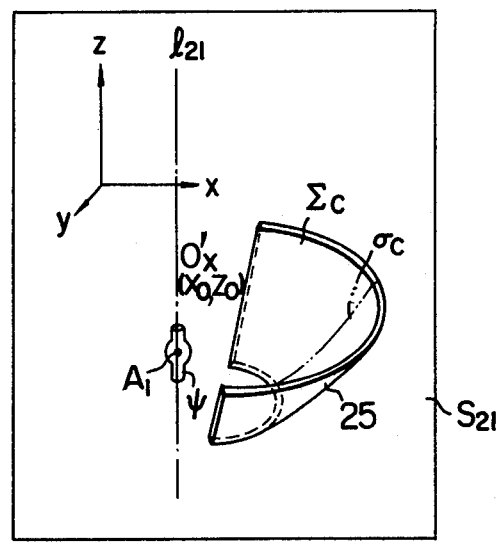
FIG. 15 is an illustration explaining the shape of the two concave mirrors used in the embodiment of FIG. 13.
Figure 17:
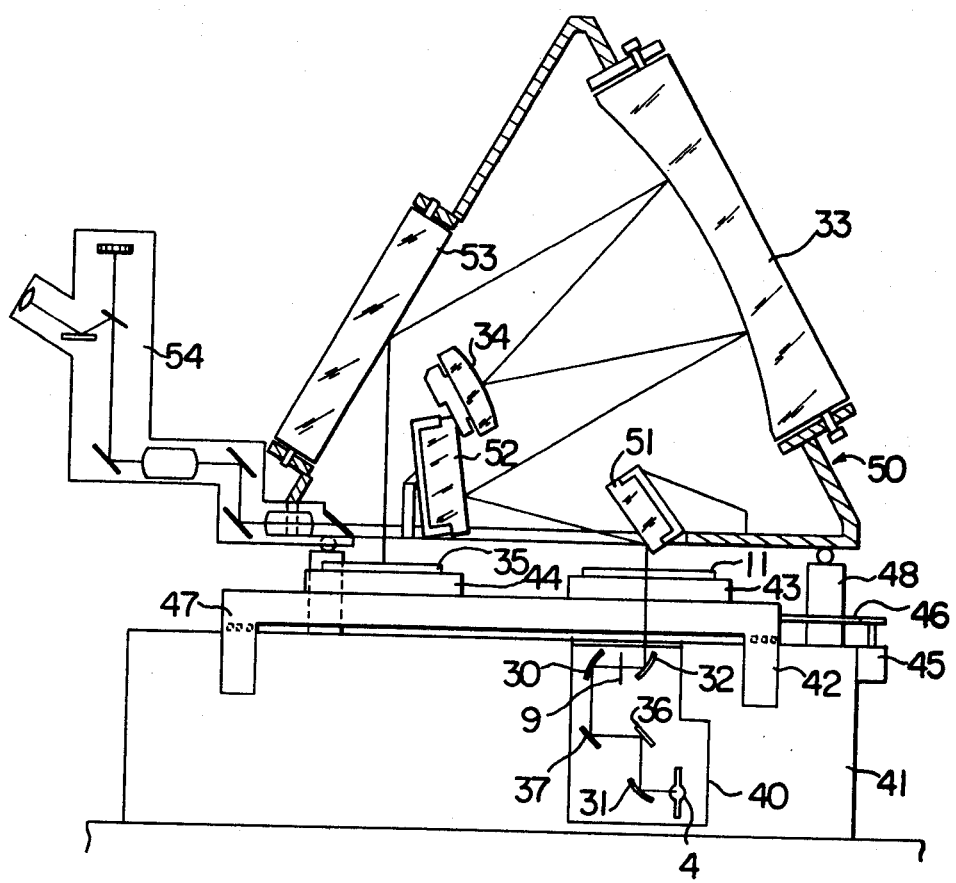

FIG. 16 is a ray tracing diagram for the arc band illumination light produced by the combined illumination system made up of two 4th-degree surfaces each having a circular cross-section shown in FIG. 13 and a 4th-degree surface having an ellipsoidal cross-section shown in FIG. 15; and FIG. 17 is an illustration showing an embodiment of the full-size reflection-type exposing apparatus with the present invention applied thereto.

The present invention will now be described in detail by way of illustrated embodiments.

When focusing a point source in order to use the lamp energy most effectively, the light beam perpendicular to the lamp, where it has the highest light distribution intensity, should be used. In addition, in order to obtain the uniform light distribution around the focal point, the most suitable optical system is the arrangement of 4th-degree surface reflectors having a revolving symmetric axis formed by a line connecting the point source position and the point source focal position, with the highest luminance portion of the lamp being placed at the point source position. Fourth-degree surface reflectors are classified by the shape of the cross-section which is cut on the plane including the revolving symmetric axis. For example, assuming two 4th-degree surface reflectors each having an ellipsoidal cross-section with one focal point located out of the revolving symmetric axis and focal point located at the point source position and the point source focal point, respectively, a light beam originated from point A1 reflects on surface S1 and focuses at C1 in the shape of arc, then further reflects on surface S2 and focuses at point A2, as shown in FIGS. 4A and 4B.

Figure 5A:
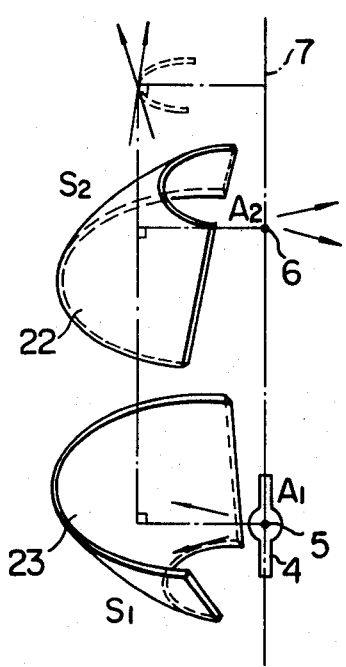
FIG. 5A is an illustration showing the arrangement of another embodiment of the present invention.
Figure 5B:
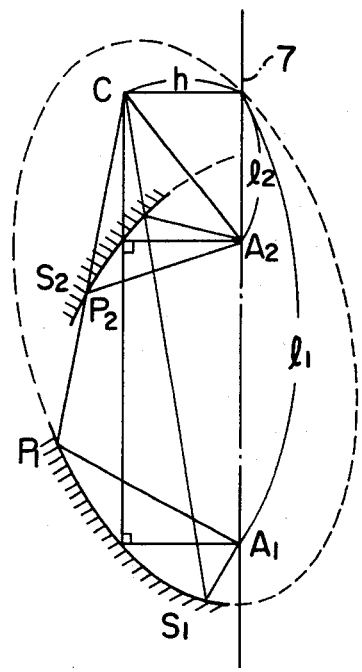
FIG. 5B is a cross-sectional view of the arrangement shown in FIG. 5A.
Figure 6A:
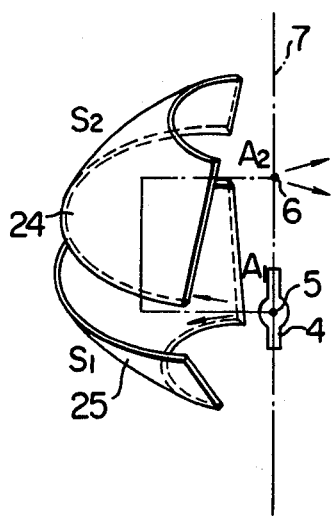
FIG. 6A is an illustration showing the arrangement of another embodiment of the present invention.
Figure 6B:
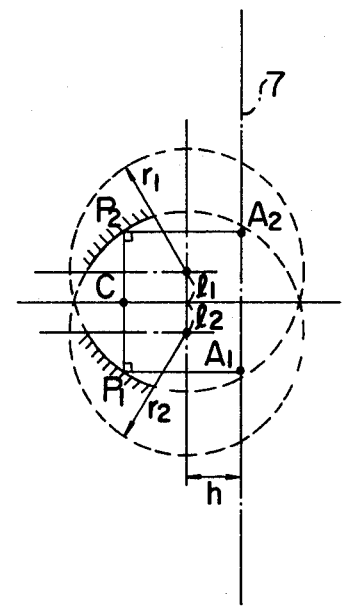
FIG. 6B is a cross-sectional view of the arrangement shown in FIG. 6A.
Figure 7A:
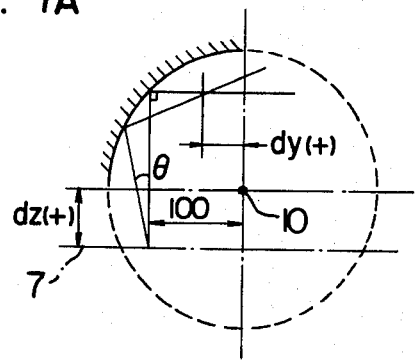
FIG. 7A is an illustration showing the portions of dz, $\theta$ and dy shown in FIGS. 6A and 6B.
Figure 7B:
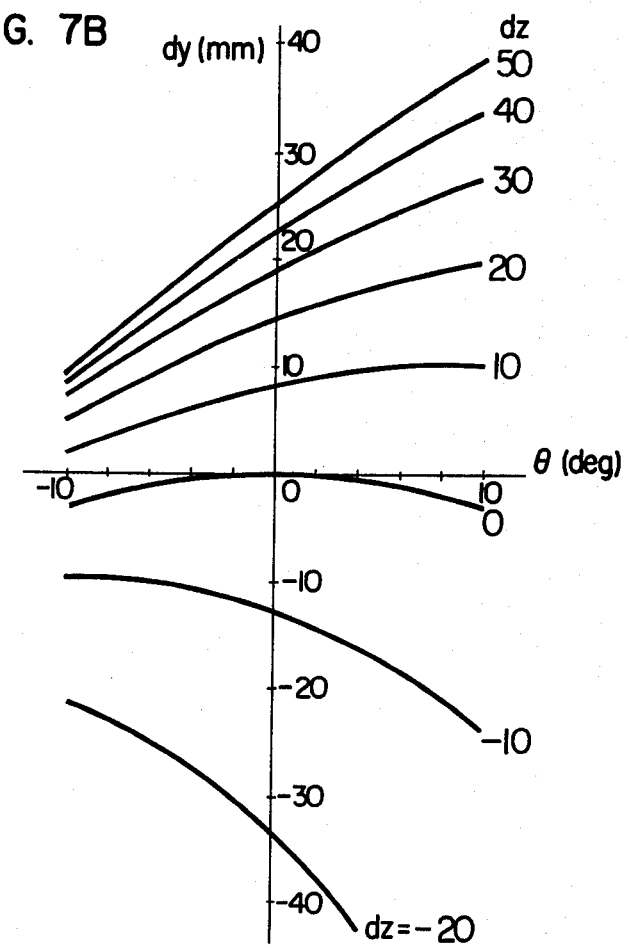
FIG. 7B is a graphical representation showing the focusing characteristics when the center of curvature is displaced from the revolving symmetric axis.

In another example, if reflectors have an ellipsoidal and hyperbolic cross-sections each having one focal point located out of the revolving symmetric axis and another focal point located at the point source position and the point source focal position, respectively, a light beam originated from point A1 focuses at point A2 as shown in FIGS. 5A and 5B. Reflectors having circular cross-sections generally cause the coma aberration. FIG. 7B shows intersections of the principal ray and a ray having an inclination of $\theta$ with respect to the principal ray measured by displacing the center of the curvature of the circle from the revolving symmetric axis as shown in FIG. 7A. In FIG. 7B, if dz is equal to zero (as disclosed in Japanese Patent Laid-open No.54-123876 and corresponding U.S. Pat. No. 4,294,538) or if dz is negative, $\theta$-dy becomes a curve and the coma aberration is not eliminated. On the other hand, if dz increases in positive, $\theta$-dy becomes a straight line, and when two 4-th-degree surface reflectors are combined with the focal point C being set temporarily to the position of dy with $\theta=0$ as shown in FIGS. 6A and 6B, the aberrations of both reflectors cancel each other, resulting in a production of a clear image. Thus the present invention allows the production of a clear point source image by using the light source energy most effectively.

Next, the reflection-type optical focusing system embodying the present invention will be described with reference to FIGS. 4A and 4B. Surfaces S1 and S2 define concave mirrors 20 and 21 on a 4th-degree surface obtained by rotating the ellipsoidal cross-sections expressed by equation (1) on a plane including their revolving symmetric axis 7.

Ellipse: $\overline{A_iP_i}+\overline{P_iC}=l_i+h=\text{const}$ ($i=1, 2$)  (1)

Figure 8A:
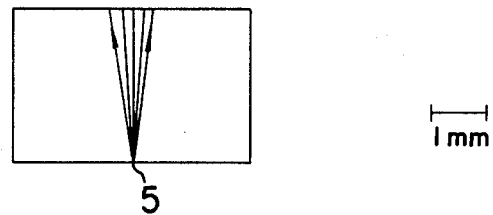
FIGS. 8A–8E are ray tracing diagrams.
Figure 8B:
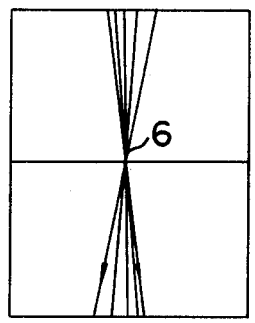

Since points A1, C and A2 are the focal points of these ellipses, the light source located at point A1 focuses to form an arc at point C, then it focuses to form a point at point A2. FIG. 8A shows the projecting ray at point A1, and FIG. 8B (ellipsoidal cross-section plus ellipsoidal cross-section) shows the incident ray at point A2. It can be seen clearly that they have better characteristics as compared with FIG. 8D (circular cross-section (with center on the axis) plus circular cross-section (with center on the axis)) which results from the prior art arrangement disclosed in Japanese Patent Laid-open No. 54-123876.

Next, another embodiment of the reflection-type optical focusing system according to the present invention will be described with reference to FIGS. 5A and 5B. Surfaces S1 and S2 define concave mirrors 22 and 23 on 4th-degree surfaces obtained by rotating the ellipsoidal and hyperbolic cross-sections expressed by equations (2) and (3), respectively, on a plane including their revolving symmetric axis 7.

Ellipse: $\overline{A_1P_1}+\overline{P_1C}=h=l_1=\text{const}$  (2)

Hyperbola: $\overline{A_2P_2}-\overline{P_2C}=h-l_2=\text{const}$  (3)

Figure 8D:
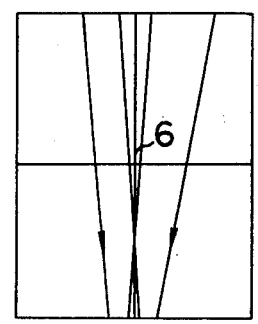
Figure 8C:
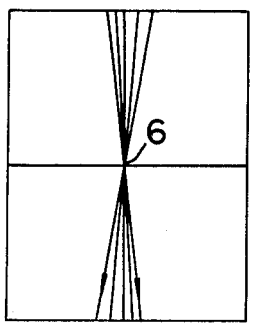

Since points A1 and C are the focal points of the ellipse and points A2 and C are the focal points of the hyperbola, the light source at point A1 forms an arc-shaped virtual image at point C, then the image focuses at point A2 to form a point. The incident ray as shown in FIG. 8C (ellipsoidal cross-section plus hyperbolic cross-section) is obtained at point A2 for the projecting ray shown in FIG. 8A. It can be seen clearly that they have better characteristics as compared with FIG. 8D which results from the prior art arrangement disclosed in the above-mentioned Japanese Patent Laid-open No. 54-123876.

Next, still another embodiment of the reflection-type optical focusing system according to the present invention will be described with reference to FIGS. 6A and 6B. Surfaces S1 and S2 define concave mirrors 24 and 25 on 4th-degree surfaces obtained by rotating the circular cross-sections expressed by equation (4) on a plane including their revolving symmetric axis 7.

$(\overline{A_iP_i}-h)^2+(\overline{P_iC_i}-l_i)^2=\gamma^2=\text{cont}$ ($i=1, 2$)  (4)

where $h > 0$.

Figure 8E:
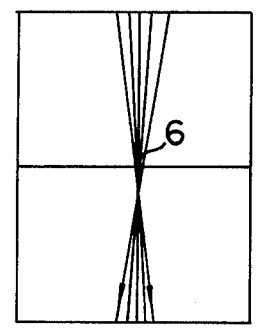

The light source located at point A1 forms an arc at point C, then it focuses at point A2 to form substantially a point. For example, in the case of the prior art arrangement disclosed in the Patent Laid-open No. 54-123876 with dimensions given as $h=l1-0.0$ mm and $\gamma=150$ mm, the projecting ray as shown in FIG. 8A results in an incident ray at point A2 as shown in FIG. 8D, whereas, according to the present invention, when the centers of the circles are located out of the revolving symmetric axis with the dimensions being given, for example, as $l1=l2=040.6$ mm, $h=75.1$ mm and $\gamma=250.0$ mm, the incident ray is improved as shown in FIG. 8E (circular cross-section (with center out of the axis) plus circular cross-section (with center out of the axis)).

The foregoing embodiments allow the formation of a clear image for realizing an ideal point source (effective point source) by gathering the lamp energy efficiently.

The following will describe the full-size reflection-type exposing apparatus using the effective point source.

Figure 9:
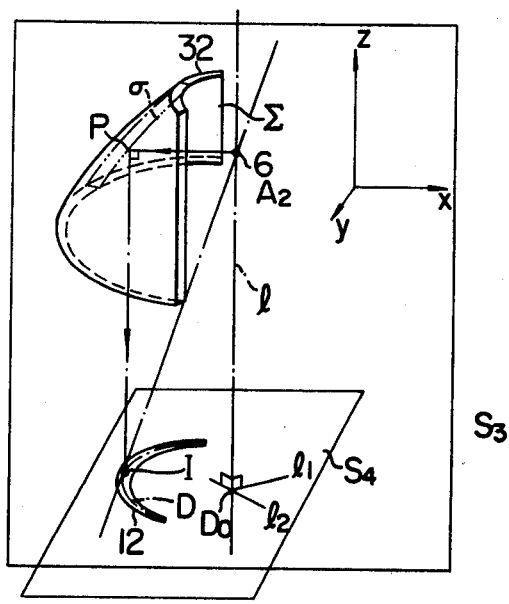
FIG. 9 is an illustration showing still another embodiment of the present invention.

First, formation of an effective point source into an arc band by use of a 4th-degree surface reflector will be described. FIG. 9 illustrates the optical system of the 4th-degree surface reflector. A line passing through the center of an arc band 12 and perpendicular to a surface S4 of the arc band is defined as a revolving symmetric axis l, and an effective point source A2 is positioned on the axis. A 4th-degree surface is formed such that its profile $\sigma$ (curve) obtained by cutting the surface on a plane S3 including the revolving symmetric axis forms an ellipse having one focal point located at the point source and another focal point at the intersection of the center line D of the arc band and the plane S3. In such arrangement, it is clear due to the ellipsoidal profile $\sigma$ that a ray emitted from the effective point source A2 and propagated on the plane S3 will reflect on the profile $\sigma$ and will focus on the intersection I of the center line D and the plane S3. More generally, a ray emitted from point A2 and reflected on the surface $\Sigma$ of the 4th-degree surface reflector will focus on arc D due to the fact that the surface $\Sigma$ has its revolving symmetric axis on the line 1 and the center line D of the arc band has its revolving symmetric axis also on the line 1. Although the effective point source A2 provides the luminous distribution extending around the arc band D due to a finite area of the light source, it illuminates the inside of the narrow arc band at a high light utilization efficiency owing to the high focusing characteristic at the point I.

Figure 10:
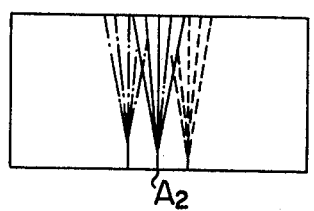
FIG. 10 is a ray diagram for the light emitted from the finite light source used for the arc band illumination, showing the effect of the present invention.

FIG. 9 shows the basic arrangement of the present invention, in which an effective point source 6 is located at point A2 (focal point of ellipse $\sigma$), and the 4th-degree surface is cut to form a reflector 32 so that a ray projected to the center of the reflection surface $\Sigma$ reflects in substantially perpendicular to the incident path. A diverging ray from the point source 6 reflects on the surface $\Sigma$ and focuses on the arc slit 12. FIG. 10 is a ray tracing diagram for a ray emitted from the center, i.e., the focal point A2, of the diverging effective point source 6 (indicated by the solid line) and a ray emitted from a point which is offset by ±0.5 mm from the point A2 (indicated by the dot and dash line).

Figure 11A:
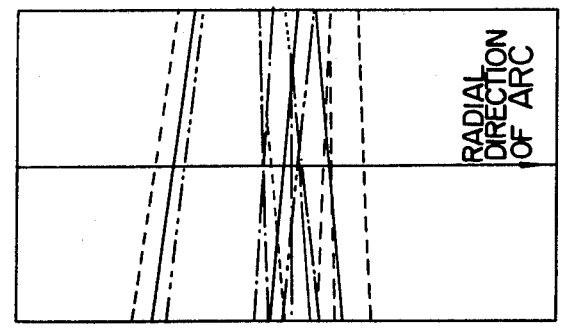
FIG. 11A is an illumination ray diagram based on the system of the present invention.
Figure 11B:
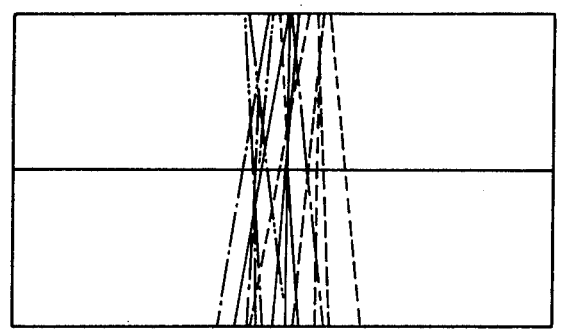
FIGS. 11B and 11C are illumination ray diagrams based on the conventional system.
Figure 11C:
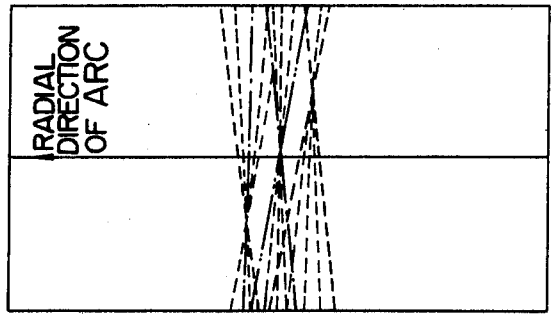

In contrast to the projecting ray shown in FIG. 10, Fig. 11A is a ray diagram on a plane perpendicular to the arc band when the 4th-degree surface having a ellipsoidal cross-section on the plane S3 is used according to the present invention. The solid line, dashed line, and dot and dash line in FIG. 10 correspond to those in FIG. 11. FIGS. 11B and 11C are ray diagrams of the conventional reflection-type optical system, Fig. 11B using a spherical mirror, Fig. 11C using the combination of three spherical mirrors. Figure 11A according to the present invention shows less failure of focusing as compared with any conventional case, and apparently a narrow area is illuminated effectively.

The following will describe the shape of the 4th-degree surface mirror used in the embodiment of FIG. 9. If the arc band has a radius of curvature of r' (equal to A2 P), and if, $$IP = mr'$$

then the 4th-degree surface $\Sigma$, with the origin located at point A2, is expressed as follows.

$$\{(2m+1)z^2 + m(m+2)(x^2+y^2) + 2m^2 r'z - m^2 r'^2\}^2 = 4m^2(R'-z)^2(x^2+y^2) \quad (5)$$

Figure 12:
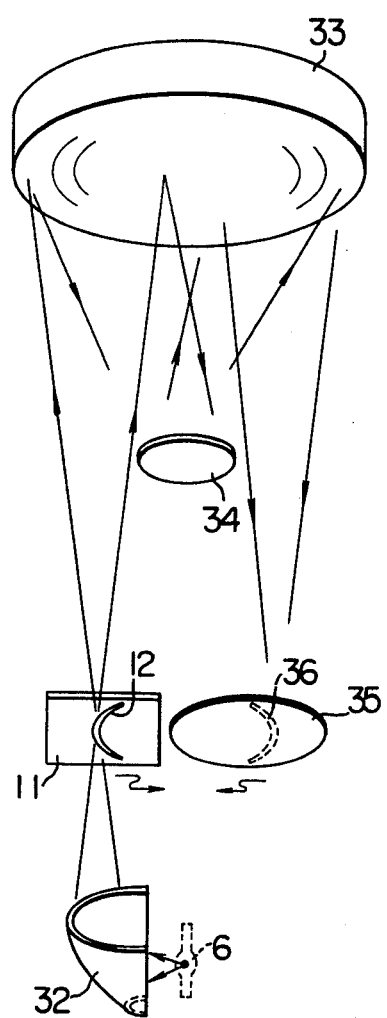
FIG. 12 is an illustration showing the optical system of the full-size reflection-type exposing apparatus embodying the present invention.

FIG. 12 shows the full-size reflection-type exposing apparatus incorporating the foregoing embodiment of the present invention. A ray emitted from the effective point source 6 reflects on the 4th-degree surface 32 expressed by equation (5), and an arc slit illumination 12 is obtained on the mask 11. The ray transmitting the mask 11 reflects on the concave mirror 33 and convex mirror 34 twice and once, respectively, and projects an image pattern 36 of the arc slit on the wafer 35. Accordingly, by scanning the wafer 35 and the mask 11 at the same speed in respective directions shown by the arrows, the pattern of the mask 11 can be exposed on the entire surface of the wafer 35.

FIG. 13 shows an embodiment of the full-size reflection-type exposing apparatus according to the present invention, in which reference number 4 denotes a point source employing a Xe-Hg lamp, and 30 and 31 are concave mirrors for converging the light emitted from the point source. In this embodiment, the following concave mirrors are used for the mirrors 20 and 21 shown in FIG. 4.

(1) The concave mirror 30 is derived from the 4th-degree surface mirror 20 defined by equation (5) with m=m1.

(2) The concave mirror 31 is derived from the 4th-degree surface mirror 21 defined by the equation (5) with m=m2.

Figure 14:
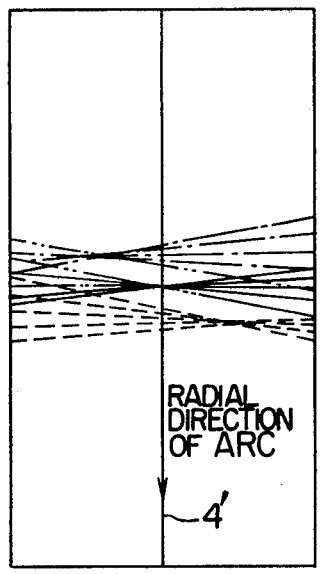
FIG. 14 is a ray tracing diagram for the arc band illumination light produced by the combination of three 4th-degree surfaces each having an ellipsoidal cross-section as shown in FIG. 13.

The spatial relationship between the concave mirrors 30 and 31 is that they have a common revolving symmetric axis and their focal points, which are the intersections of a plane including the revolving symmetric axis and the reflection surfaces of both concave mirrors and are located out of the revolving symmetric axis, are located substantially at the same point. In this arrangement, the 4th-degree surface mirrors 20 and 21 provide an effective point source at point 6. Using this effective point source as a new point source, an arc band illumination 12 can be obtained by use of a 4th-degree surface 32 in the same way as in the embodiment shown in FIG. 9. FIG. 14 is a ray diagram for the illumination system formed by the combination of three 4th-degree surfaces each having an ellipsoidal cross-section, showing the characteristics of a ray emitted from the center A1 of the light source 4 in the arrangement of FIG. 13 (indicated by the solid line) and rays emitted from the points which are offset by ±0.5 mm from the center (indicated by the dashed line, and dot and dash line) on the mask 11 shown in FIG. 13. The figure shows that a better arc band illumination can be obtained as compared with the cases of FIGS. 11B and 11C.

Next, another embodiment will be described in connection with FIG. 13. In this embodiment, concave mirrors 30 and 31 are of the type shown by 24 and 25 in FIG. 6.

(3) Concave mirror 31: Identical to mirror 25

As shown in FIG. 15, the concave mirror 25 has a revolving symmetric axis 121 passing through a light source 4, and the intersection of a plane S21 (x/z plane) including the symmetric axis and the concave mirror 25 defines a circle with its center located out of the ray axis 121. When the light source is located on the origin, the center of the circle is located at $(x_0, z_0)$, and the surface $\Sigma$ of the concave mirror 25 satisfies the following 4th-degree equation.

$$\{r^2_c - (z-z_0)^2 - x^2 - y^2 - x_0^2\}^2 - 4x_0^2(x^2+y^2) = 0 \quad (6)$$

(4) Concave mirror 30: Identical to mirror 24

The concave mirror 30 is identical to that shown in FIG. 15 and has the same revolving symmetric axis. The location of point 0″ corresponding to point 0′ of the mirror 25 is defined, for example, as 0′−0″=81 mm when rc=250 mm, xo−75 mm and zo−177 mm.

The ray diagram on the mask surface 4 according to this embodiment is shown in FIG. 16 (the illumination ray by the illumination system formed by the combination of two 4th-degree surface each having a circular cross-section and a 4th-degree surface having an ellipsoidal cross-section). The figure shows that the similar or better arc band illumination 9s obtained as compared with the case of FIG. 14. It will be appreciated that light emitted from the point source 4 and traveling in directions opposite to the concave mirror 31 can be used effectively by provision of a spherical mirror 13 having its center of curvature located at the point source.

Figure 1:
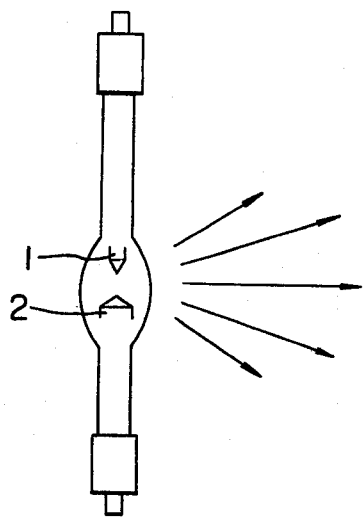
FIG. 1 shows an external view of the lamp used as a point source.

Next, still another embodiment will be described in connection with FIG. 13 and FIG. 5. The light emitted from the lamp 4, used as a point source, is converged to form an arc band shown by the dashed line in FIG. 5 using a 4th-degree surface mirror having its revolving symmetric axis formed by the line 7 shown in the embodiment of FIG. 1 and also having an ellipsoidal cross-section. If a 4th-degree concave mirror 22, having a hyperbolic cross-section with its focal points located on the arc and having the revolving symmetric axis 7, is inserted between the ellipsoidal concave mirror and the arc, the light emitted from the light source 4 will converge to form an effective point source at point 6.

Figure 3:
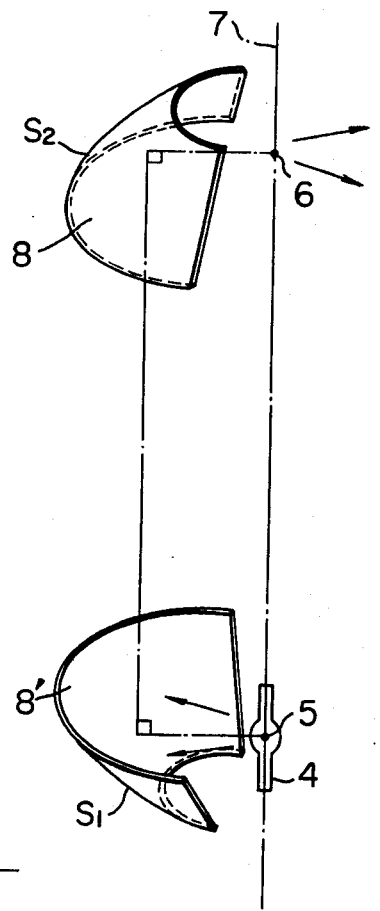
FIG. 3 is an illustration showing the present invention.
Figure 2A:
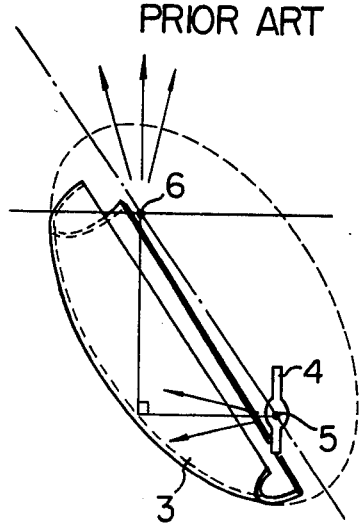
FIG. 2A is a perspective view showing the optical focusing system for a point source using the conventional ellipsoidal reflector.
Figure 2B:
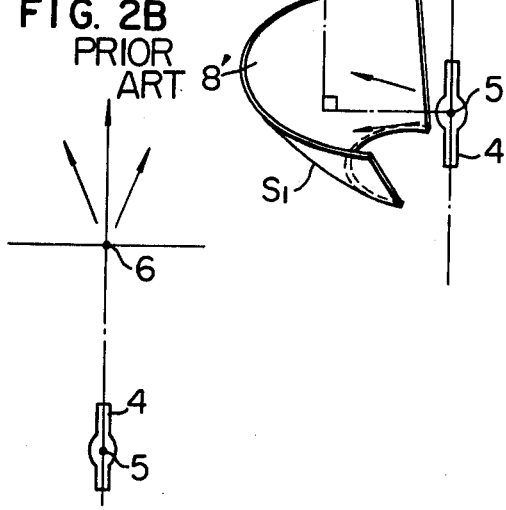
FIG. 2B is a side view of the optical system shown in FIG. 2A.

In converging the point source originated from the lamp to form an effective point source by using the foregoing reflection-type optical system, if a pinhole filter 9 having a circular opening (pinhole) is placed at the focal point as shown in FIG. 13, the area of the light source can be made smaller so that it further approaches the real point source. The optical systems as shown in FIGS. 3, 4A and 5A can be replaced by a simple and ideal point light source.

The full-size reflection-type exposing apparatus using the reflection-type optical focusing apparatus according to the present invention will be described with reference to FIG. 17. Reference number 40 denotes the reflection-type optical focusing apparatus shown in FIG. 13, and it is mounted on a flat plate 41. In order to take a longer distance between the concave mirrors 30 and 31, the apparatus is provided with flat reflectors 36 and 37. A moving tray 42 is supported slidably by a bearing 47 on the flat plate 41. A means 43 for holding a mask 11 is fixed on the moving tray 42. An X-Y-θ table 44 for mounting a wafer 35 is fixed on the moving tray 42. Reference number 45 denotes a driving power source for moving the tray 42, and its output is connected through a steel belt or the like 46 to the moving tray 42. A full-size reflection-type optical system 50 includes reflectors 51, 52 and 53, a concave spherical mirror 33 and a convex spherical mirror 34, and it is mounted on a support 48 provided on the flat plate 41. Reference number 54 denotes an optical detection system for registering the alignment pattern on the wafer 11 to the alignment pattern on the mask 35. In the foregoing arrangement, the wafer 35 and the mask 11 are aligned by using the optical detection system 54, thereafter circuit patterns projected in the form of an arc band on the mask 35 by the reflection-type focusing apparatus 40 is transferred onto the wafer 11 by moving the tray 42 in a certain direction.

The reflection-type optical focusing apparatus according to the present invention can be used not only for the above-mentioned full-size reflection-type exposing apparatus, but more extensively for exposing apparatus of the type where exposure is carried out by scanning the mask and wafer. For example, application of the apparatus to a contact exposing apparatus and proximity exposing apparatus using ultraviolet rays or deep ultraviolet rays provides the following advanced characteristics as compared with the conventional system. It has been impossible to obtain a uniform and parallel illumination ray from a point source solely by using a reflection-type optical system, and therefore, fly-eye lens made of transmitting quartz and quartz lens have been used. However, such optical system using expensive quartz components has not provided a satisfactory uniform and parallel illumination ray. The illumination apparatus for exposing apparatus according to the present invention achieves a constant luminous level in any place on the arc band and also a satisfactory parallel ray. Moreover, the illumination apparatus for exposing apparatus according to the present invention does not need transmitting optical components (by choosing the value of m in the range from 2 to 5), thereby allowing the low-cost design. This advantage is further stressed for the light having a shorter wave length for which transmitting optical components cannot be used.

According to the present invention, as described above by way of embodiment, the light emitted from a point source or a light source having a small lighting area similar to the point source can be projected to a narrow area in the form of an arc band clearly, whereby only the narrow arc band pattern can be exposed onto the wafer. Therefore, only the satisfactory narrow arc band area produced by the optical projection system made up basically of concave and convex mirrors is used to expose the wafer by scanning the mask and wafer at a high speed, and a high resolution pattern can be transferred to the wafer at a high speed.

Thus the present invention is very effective for improving the quality of focusing and economical condition at the same time.

We claim:

1. A reflection-type optical focusing apparatus comprising a 4th-degree surface reflector with its cross-section, on a plane including a revolving symmetric axis, forming a part of an ellipse with its major axis having a certain inclination with respect to said revolving symmetric axis, a virtual point source being located at one focal point of said ellipse so that a light image in the shape of an arc band is produced.

2. A reflection-type optical focusing apparatus according to claim 1, further comprising at least two 4th-degree surface reflectors having their revolving symmetric axis formed by a line connecting the position of a point source and the point source focusing position, said reflectors being used in combination such that the light emitted from a point source located at said point source position is focused to form a virtual point source at said point source focusing position.

3. A reflection-type optical focusing apparatus according to claim 2, wherein said two 4th-degree surface reflectors have their conjugate points located at said point source position and said point source focusing position, said reflectors comprising a first 4th-degree surface reflector with its cross-section, on a plane including said revolving symmetric axis, forming a part of an ellipse having its focal points located at one of said conjugate points and a point out of said revolving symmetric axis, and a second 4th-degree surface reflector with its cross-section, on a plane including said revolving symmetric axis, forming a part of an ellipse having its focal points located at a point out of said revolving symmetric axis and another one of said conjugate points.

4. A reflection-type optical focusing apparatus according to claim 2, wherein said two 4th-degree surface reflectors have their conjugate points located at said point source position and said point source focusing position, said reflectors comprising a first 4th-degree surface reflector with its cross-section, on a plane including said revolving symmetric axis, forming a part of an ellipse having its focal points located at one of said conjugate point and a point out of said revolving symmetric axis, and a second 4th-degree surface reflector with its cross-section, on a plane including said revolving symmetric axis, forming a part of a hyperbola having its focal points located at a position out of said revolving symmetric axis and another one of said conjugate points.

5. A reflection-type optical focusing apparatus according to claim 2, wherein said two 4th-degree surface reflectors have their conjugate points located at said point source position and said point source focusing position, each of said reflectors having its cross-section, on a plane including said revolving symmetric axis, forming a part of a circle with its center of curvature located out of said revolving symmetric axis.

6. A reflection-type optical focusing apparatus according to claim 2, wherein a small circular aperture is provided at the position of said virtual point source.

7. A reflection-type optical focusing apparatus for use in an exposing apparatus which focuses a light image illuminated on a mask in the shape of an arc band onto a wafer by means of an optical focusing system, said focusing apparatus comprising an optical focusing system including at least two 4th-degree surface reflectors with their revolving symmetric axis formed by a line connecting the position of a point source and the point source focusing position, said reflectors being used in combination so that the light emitted from a point source placed at said point source position is focused to form a virtual point source at said point source focusing position, and a 4th-degree surface reflector with its cross-section, on a plane including a revolving symmetric axis, forming a part of an ellipse with its major axis having a certain inclination with respect to said revolving symmetric axis, said virtual point source being located at one focal point of said ellipse so that said light image in the shape of an arc band is obtained.

8. A reflection-type optical focusing apparatus for use in an exposing apparatus according to claim 7, wherein said optical focusing system in said exposing apparatus comprises a full-size reflection-type optical system including a concave spherical mirror and a convex spherical mirror.

9. A reflection-type optical focusing apparatus according to claim 2, wherein the reflection-type optical focusing apparatus is arranged for use in an exposing apparatus which focuses a light image illuminated on a mask in the shape of an arc band onto a wafer by means of the reflection-type optical focusing apparatus.

10. A reflection-type optical focusing apparatus according to claim 9, comprising a full-size reflection-type optical system.

11. A reflection-type optical focusing apparatus according to claim 10, wherein the full-size reflection-type optical system includes a concave spherical mirror and a convex spherical mirror.

12. A reflection-type optical focusing apparatus for use in an exposing apparatus which focuses a light image illuminated on a mask in the shape of an arc band onto a wafer by means of an optical focusing system, said focusing aparatus comprising an optical focusing system including a 4th-degree surface reflector with its cross-section, on a plane including a revolving symmetric axis, forming a part of an ellipse with its major axis having a certain inclination with respect to said revolving symmetric axis, a virtual point source being located at one focal point of said ellipse so that a light image in the shape of an arc band is produced.

13. A reflection-type optical focusing apparatus for use in an exposing apparatus according to claim 12, wherein said optical focusing system includes at least two 4th-degree surface reflectors having their revolving symmetric axis formed by a line connecting the position of a point source and the point source focusing position, said reflectors being used in combination such that the light emitted from a point source located at said point source position is focused to form said virtual point source at said point source focusing position.

14. A reflection-type optical focusing aparatus for use in an exposing apparatus according to claim 13, wherein said optical focusing system in said exposing aparatus comprises a full-size reflection-type optical system including a concave spherical mirror and a convex spherical mirror.

* * * * *